US010461044B2

(12) United States Patent
Zhang

(10) Patent No.: US 10,461,044 B2
(45) Date of Patent: Oct. 29, 2019

(54) WAFER LEVEL FAN-OUT PACKAGE AND METHOD OF MANUFACTURING THE SAME

(71) Applicant: SAMSUNG ELECTRONICS CO., LTD., Suwon-si, Gyeonggi-Do (KR)

(72) Inventor: Peng Zhang, Hwasung-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/677,049

(22) Filed: Aug. 15, 2017

(65) Prior Publication Data

US 2018/0261553 A1 Sep. 13, 2018

(30) Foreign Application Priority Data

Mar. 10, 2017 (CN) .......................... 2017 1 0144202

(51) Int. Cl.
*H01L 21/00* (2006.01)
*H01L 23/00* (2006.01)
(Continued)

(52) U.S. Cl.
CPC ........ *H01L 23/562* (2013.01); *H01L 21/4857* (2013.01); *H01L 21/565* (2013.01);
(Continued)

(58) Field of Classification Search
CPC . H01L 23/562; H01L 21/4857; H01L 21/565; H01L 21/568; H01L 23/13;
(Continued)

(56) References Cited

U.S. PATENT DOCUMENTS 9,318,429 B2 4/2016 Hu et al.
9,431,335 B2 8/2016 Hu
(Continued)

FOREIGN PATENT DOCUMENTS

CN 103972217 A 8/2014
CN 104051364 A 9/2014
(Continued)

OTHER PUBLICATIONS

Chinese Office Action dated Aug. 28, 2018 in corresponding Chinese Application No. CN 201710144202.7.

*Primary Examiner* — Richard A Booth
(74) *Attorney, Agent, or Firm* — Volentine, Whitt & Francos, PLLC

(57) ABSTRACT

A method of manufacturing a wafer level fan-out package includes preparing a base substrate having a protrusion, providing a chip on a surface of the base substrate adjacent to and spaced from the protrusion, forming an encapsulation layer on the base substrate to encapsulate the chip and the protrusion, removing the base substrate to expose a surface of the chip and to form a recess corresponding to the protrusion in the encapsulation layer, and providing a passive element in the recession. The method obviates a problem of displacement of the passive element by thermal expansion of the encapsulation layer while it is being formed because the passive element is incorporated into the package after the encapsulation layer is formed.

12 Claims, 7 Drawing Sheets

220
240
250
241
230

(51) Int. Cl.

| | |
|---|---|
| ***H01L 21/56*** | (2006.01) |
| ***H01L 21/48*** | (2006.01) |
| ***H01L 23/31*** | (2006.01) |
| ***H01L 23/538*** | (2006.01) |
| ***H01L 23/13*** | (2006.01) |
| *H01L 23/498* | (2006.01) |

(52) U.S. Cl.

CPC ............ *H01L 21/568* (2013.01); *H01L 23/13* (2013.01); *H01L 23/3114* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 21/4853* (2013.01); *H01L 23/49816* (2013.01); *H01L 2224/12105* (2013.01); *H01L 2224/18* (2013.01); *H01L 2224/19* (2013.01); *H01L 2224/96* (2013.01); *H01L 2924/1815* (2013.01); *H01L 2924/19101* (2013.01); *H01L 2924/19105* (2013.01); *H01L 2924/351* (2013.01)

(58) Field of Classification Search

CPC ............. H01L 23/3114; H01L 23/5383; H01L 23/5386; H01L 23/5389; H01L 24/19; H01L 24/20

See application file for complete search history.

(56) References Cited

U.S. PATENT DOCUMENTS

2014/0264808 A1* 9/2014 Wolter ................ H01L 25/0657 257/678
2014/0353836 A1* 12/2014 O'Sullivan ............. H01L 21/56 257/773
2015/0333729 A1 11/2015 Choi
2016/0240520 A1 8/2016 Ho et al.
2016/0268234 A1 9/2016 Lin et al.
2016/0300813 A1 10/2016 Zhai et al.
2016/0358848 A1 12/2016 Meyer et al.

FOREIGN PATENT DOCUMENTS

CN 105981159 A 9/2016
WO WO2015137936 A1 9/2015

* cited by examiner

WAFER LEVEL FAN-OUT PACKAGE AND METHOD OF MANUFACTURING THE SAME

PRIORITY STATEMENT

This application claims the benefit of priority under 35 U.S.C. § 119 to Chinese Patent Application No. 201710144202.7 filed on Mar. 10, 2017, the entire contents of which are hereby incorporated by reference in their entirety.

BACKGROUND

1. Field

The inventive concept relates to semiconductor device packaging technologies. More particularly, the inventive concept relates to a wafer level fan-out package integrated with a passive element and to a method of manufacturing the wafer level fan-out package.

2. Description of the Related Art

Currently, in a wafer level fan-out package integrated with a passive element, due to different coefficients of thermal expansion (CTE) of elements within the wafer level fan-out package, a displacement of the passive element is liable to occur in the wafer level fan-out package, so that a poor electrical connection is established between a circuit layer subsequently formed on the passive element and the passive element. For example, when semiconductor chips and the passive element are encapsulated with an encapsulating material such as an epoxy resin, a displacement of the passive element might occur due to thermal expansion and contraction of the encapsulating material.

FIGS. 1A-1D are cross-sectional views illustrating a method of manufacturing a wafer level fan-out package according to the prior art.

Referring to FIG. 1A, a chip 120 and a passive element 130 disposed separately from the chip 120 are formed on a base substrate 110, and an encapsulating layer 140 is formed on the base substrate 110 to encapsulate the chip 120 and the passive element 130.

Referring to FIG. 1B, the base substrate 110 is then removed from the chip 120 and the passive element 130 to expose surfaces of the chip 120 and the passive element 130.

Next, referring to FIG. 1C, a circuit layer 150 is formed on the exposed surfaces of the chip 120 and the passive element 130.

Lastly, referring to FIG. 1D, solder balls 160 are formed on the circuit layer 150.

When forming the encapsulating layer 140 to encapsulate the chip 120 and the passive element 130, a displacement of the passive element 130 might occur due to thermal expansion and contraction of materials of the encapsulating layer 140, so that a poor electrical connection is established between the circuit layer 150 formed on the passive element and the passive element 130.

SUMMARY

According to the inventive concept, there is provided a method of manufacturing a wafer level fan-out package, including providing a base substrate having a surface and a protrusion protruding from the surface, setting a chip on the surface of the base substrate adjacent to and spaced laterally from the protrusion, forming an encapsulation layer on the base substrate to encapsulate the chip and the protrusion, removing the base substrate to expose a surface of the chip and to form a recess corresponding to the protrusion in the encapsulation layer, and providing a passive element in the recess.

According to another aspect of the inventive concept, there is provided a wafer level fan-out package, comprising a chip having an upper surface, a lower surface opposite to the upper surface and end portions, an encapsulation layer covering the upper surface and the end portions of the chip, exposing the lower surface of the chip and having an opening in a side thereof facing in the same direction as the lower surface of the chip, a circuit layer extending along the lower surface of the chip and within the opening, and a passive element situated within the opening and electrically conductively connected to the circuit layer, wherein the circuit layer is interposed between the passive element and the encapsulation layer.

According to the inventive concept, there is also provided a method of manufacturing a wafer level fan-out package, including placing a chip and a base substrate against each other with an active surface of the chip facing the base substrate, encapsulating the chip by forming an encapsulant on the base substrate, removing the base substrate to expose the active surface of the chip and a surface of the encapsulant adjacent to the chip, forming a wiring structure on the active surface of the chip and on the surface of the encapsulant adjacent to the chip, and subsequently mounting a passive electronic component on and electrically connecting the passive electronic component to the wiring structure.

According to the inventive concept, there is also provided a method of manufacturing a wafer level fan-out package, including encapsulating a chip in an encapsulant with an active surface of the chip exposed and a recess defined in surface of the encapsulant adjacent to the active surface of the chip, forming a wiring structure extending over the active surface of the chip and that lines the recess while leaving a portion of the recess unfilled, and setting a passive electronic component within the unfilled portion of the recess and mounting the passive electronic component on and electrically connecting the passive electronic component to the wiring structure within the recess.

BRIEF DESCRIPTION OF THE DRAWINGS

These and/or other aspects of the inventive concept will become more apparent and readily understood from the following detailed description of examples of the inventive concept taken in conjunction with the accompanying drawings, in which.

DETAILED DESCRIPTION

The inventive concept will be now described more fully with reference to the accompanying drawings, in which an example of the inventive concept is shown. However, the inventive concept may be embodied in many different forms, and should not be construed as being limited to the example disclosed herein; rather, this example is provided so that this disclosure will be thorough and complete, and will fully convey the inventive concept to those ordinary skilled in the art.

Figure 1A:
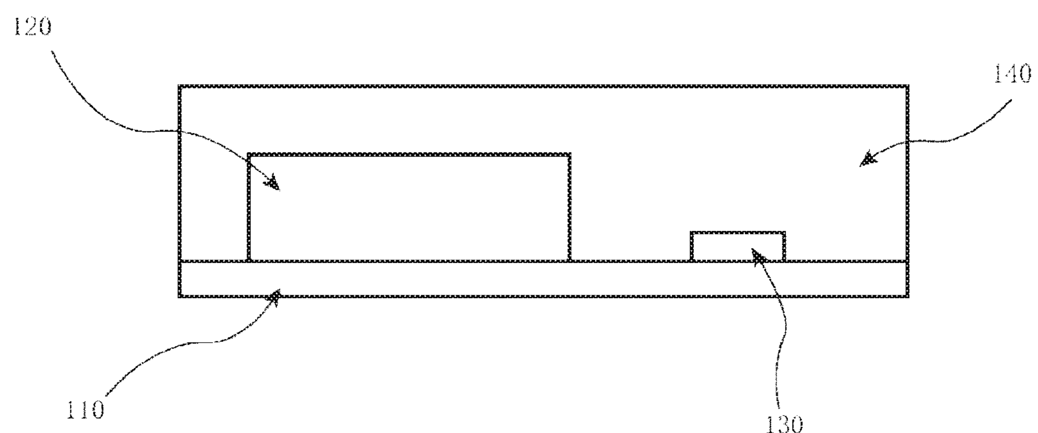
FIGS. 1A-1D are cross-sectional views of a wafer level fan-out package during the course of its manufacture and illustrating a prior arts method of manufacturing the package.
Figure 1B:
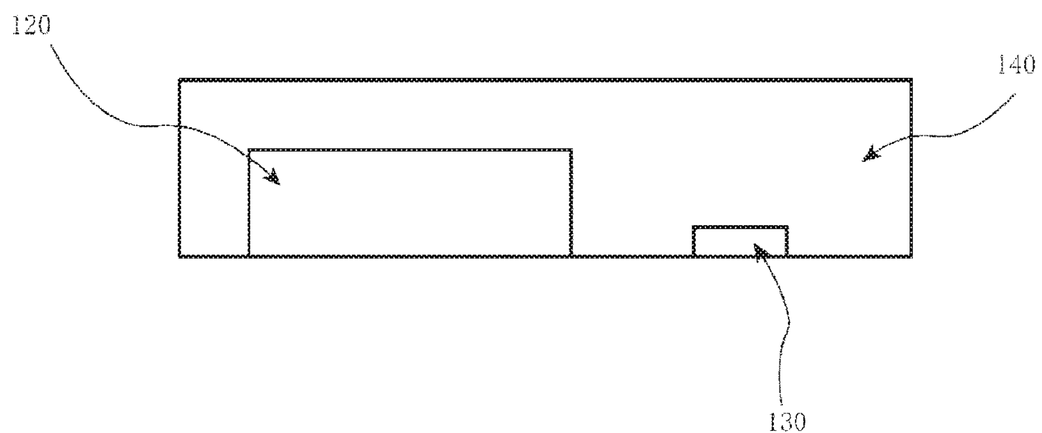
Figure 1C:
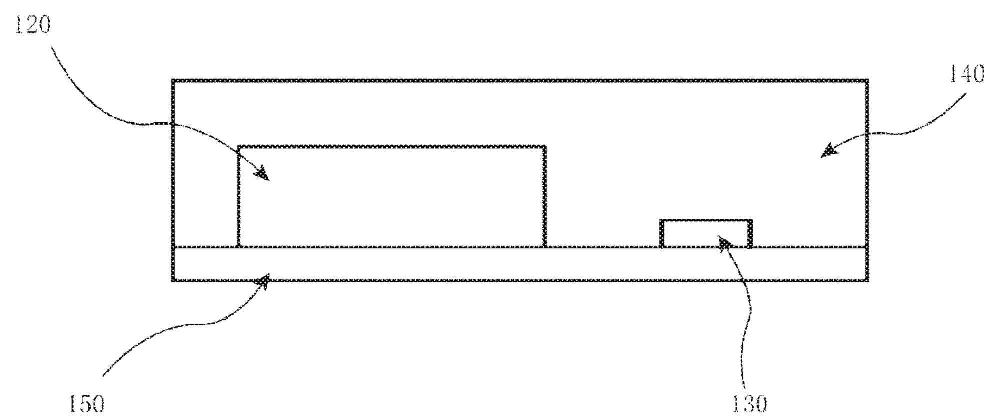
Figure 1D:
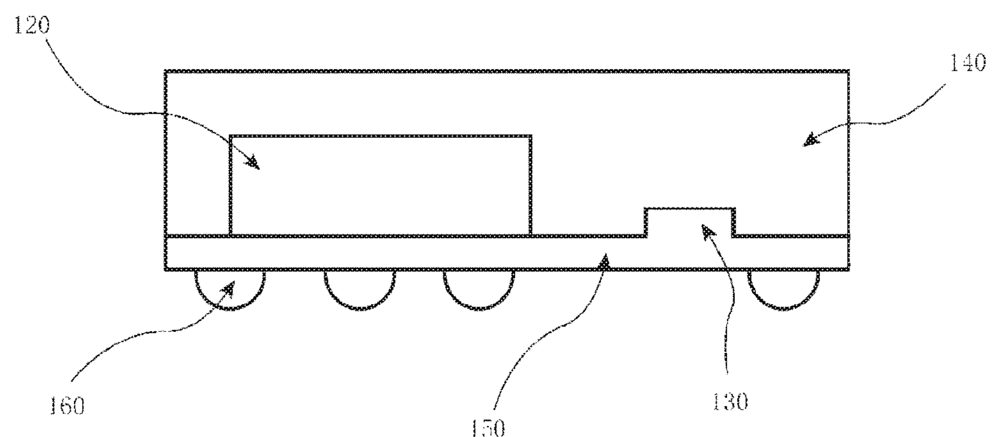
Figure 2:
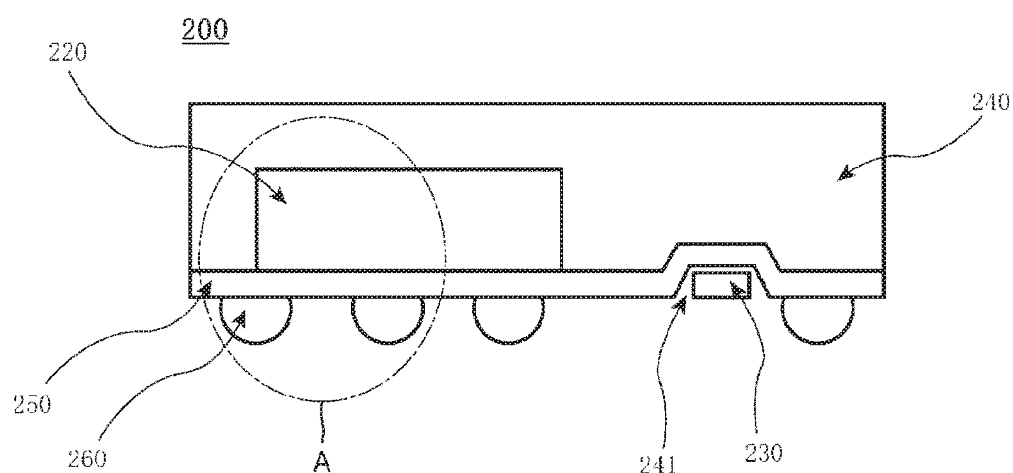
FIG. 2 is a schematic diagram of a cross section of an example of a wafer level fan-out package according to the inventive concept.
Figure 9:
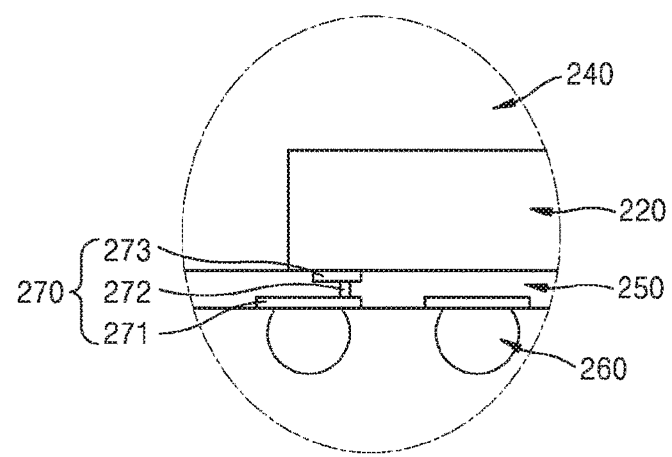
FIG. 9 is an enlarged view of portion A of FIG. 2 to illustrate, schematically, a wiring structure constituting a circuit layer of a wafer level fan-out package according to the inventive concept.

Referring to FIGS. 2 and 9, a wafer level fan-out package 200 according to the inventive concept includes a chip 220 having an upper surface, a lower surface opposite to the upper surface and end portions, and an encapsulation layer 240 covering the upper surface and the end portions of the chip 220 and exposing the lower surface of the chip 220. The encapsulation layer 240 defines an opening (or a recess) 241 therein on the same side as the lower surface of the chip 220, i.e., on a side thereof facing in the same direction as the lower surface of the chip 220. A circuit layer 250 extends along the lower surface of the chip 220 and lines the recess 241. The forming of the circuit layer 250 on the lower surface of the chip 220 and in the recess 241 may be performed using a variety of wiring technology. For example, a printed circuit board (PCB) (e.g., a flexible PCB film) may be attached, or deposition and patterning technology with respect to dielectric films and wiring patterns in semiconductor manufacturing processes may be used, but the present inventive concept is not limited thereto. The circuit layer 250, as shown in FIG. 9, may have a redistribution wiring layer 270 including a wiring patterns 271, 273 and wring vias 272 connected to the wiring patterns 271, 273.

The wafer level fan-out package 200 also includes a passive element (or "passive electronic component") 230 disposed in the recess 241 and electrically conductively connected within the recess 241 to the circuit layer 250. Passive electronic components as well understood in the art include resistors, capacitors, inductors and the like.

The chip 220 may be of a type well known in the art and thus, will not be described in further detail. The chip 220 is spaced laterally from the recess 241 that receives the passive element 230. In the present example of the inventive concept, the encapsulation layer 240 comprises an epoxy resin. However, other materials may be used the encapsulation layer 240. In examples of the inventive concept, the recess 241 has a depth of 50 to 100 μm in the encapsulation layer 240, i.e., a dimension of 50 to 100 μm in a vertical direction or direction perpendicular to the upper surface of the chip 220. However, the inventive concept is not limited thereto, and the recess 241 may have any depth appropriate for accommodating the passive element 230.

The passive element 230 may contact the circuit layer 250. In an example of the inventive concept, the passive element 230 may be formed on the circuit layer 250 through reflow soldering but, the inventive concept is not limited to such a manner of providing the passive element 230 within the recess 241. In any case, the circuit layer 250 is interposed between the passive element 230 and the encapsulation layer 240.

A method of manufacturing a wafer level fan-out package according to an exemplary embodiment of the present disclosure will be hereinafter described in detail with reference to FIGS. 3-8.

FIGS. 3-8 illustrate an example of a method of manufacturing a wafer level fan-out package according to the inventive concept.

Figure 3:
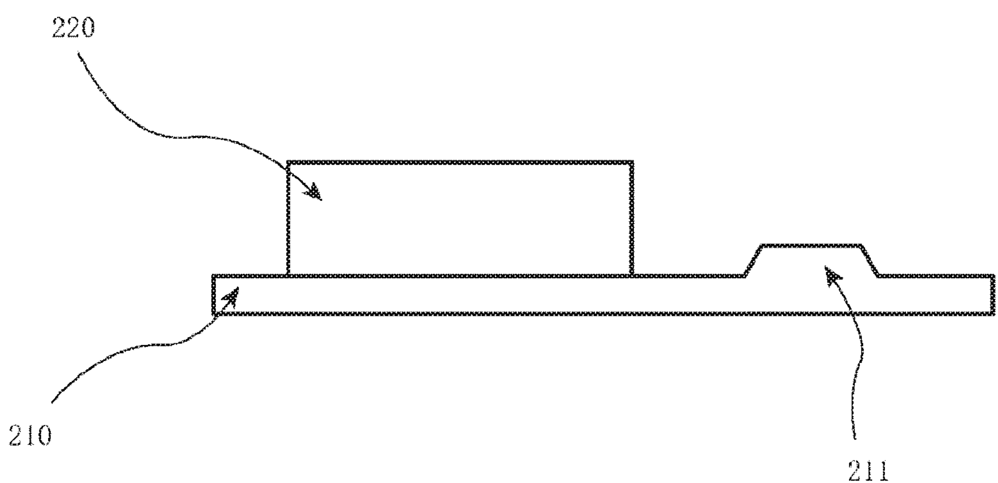
FIGS. 3, 4, 5, 6, 7 and 8 are cross-sectional views of a wafer level fan-out package during the course of its manufacture and together illustrating an example of a method of manufacturing the same according to the inventive concept.

Referring to FIG. 3, first, a base substrate 210 having a protrusion 211 is prepared, and then a chip 220 is provided on a surface of and attached to the base substrate 210 on which the protrusion 211 is provided, with the chip 220 disposed laterally of and spaced from the protrusion 211. The chip 220 and the base substrate 210 may be placed against each other with an active surface of the chip facing a surface of the base substrate 210 adjacent to the protrusion 211.

In examples of the inventive concept, the distance between the upper surface of the protrusion 211 and the upper surface of the base substrate 210 from which the protrusion 211 extends is 50 to 100 μm. Also, the base substrate 210 and the protrusion 211 may be unitary; however the inventive concept is not limited thereto. For example, the protrusion 211 may be formed separately on but integral with the base substrate 210.

Figure 10:
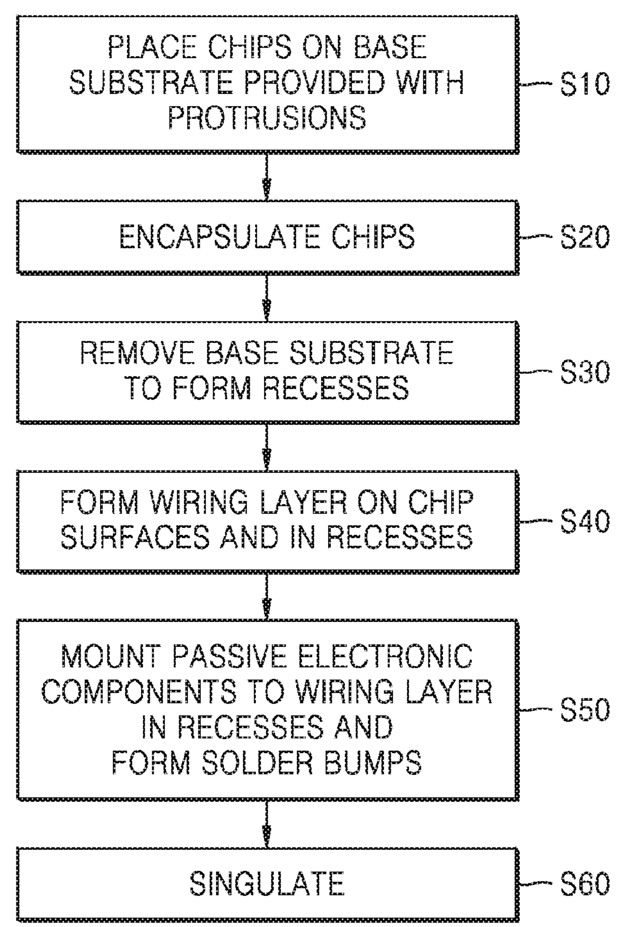
FIG. 10 is a flow chart of an example of a wafer level fan-out method of fabricating semiconductor packages according to the inventive concept.

Furthermore, although only one chip 220 is shown as being mounted to the base substrate 210, in a wafer level manufacturing method according to the inventive concept (FIG. 10) a plurality of chips 220 can be mounted to the base substrate 210 with the base substrate 210 including protrusions 211 disposed adjacent to and associated with the chips 220, respectively. S10

Figure 4:
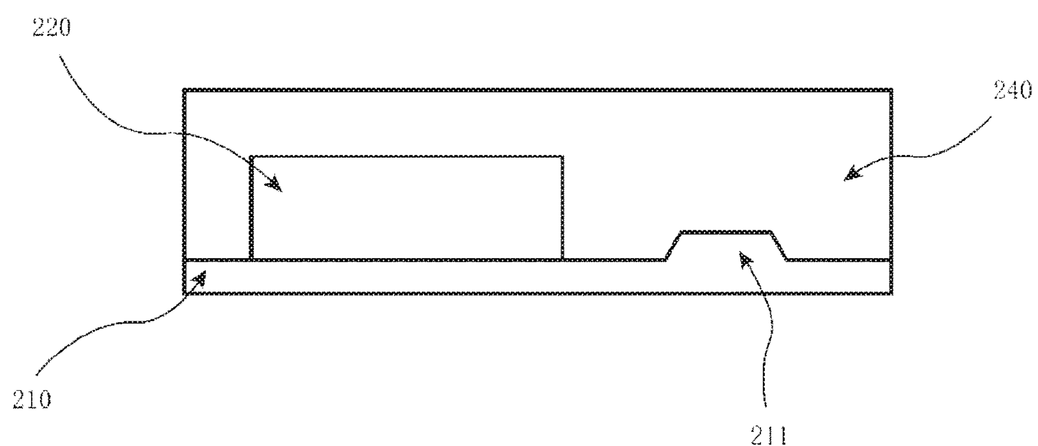

Referring to FIG. 4, subsequently, an encapsulation layer 240 or simply "encapsulant" is formed on the base substrate 210 to encapsulate the chip 220 and the protrusion 211. In an example of the inventive concept, the encapsulation layer 240 is formed epoxy resin; however, other materials may be used instead. Also, the encapsulation layer 240 may be formed by any method known per se in the art for forming encapsulant in the field.

Furthermore, the molding process shown and described here may be applied at a wafer level across a plurality of the chips 220 attached to the base substrate 210. That is, the encapsulation layer 240 may be formed to cover a plurality of the chips 220 and associated protrusions 211. S20 in FIG. 10.

Figure 5:
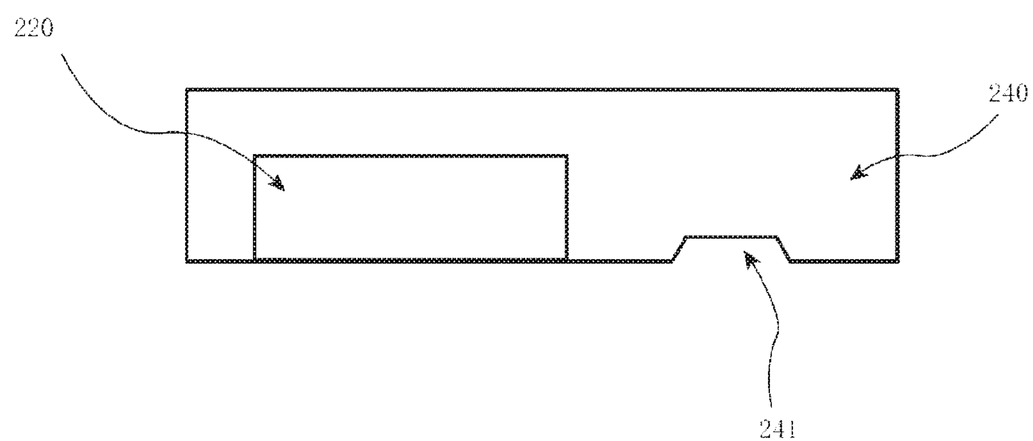

Next, referring to FIG. 5, the base substrate 210 is removed from the encapsulation layer 240 to expose a surface of the chip 220 and to form a depression or opening 241 (referred to hereinafter as a "recess") in the encapsulation layer 240. Because the base substrate 210 having the protrusion 211 is removed from the encapsulation layer 240, the recess 241 is formed while exposing the surface of the chip 220. The recess thus has a shape complementary to that of the protrusion 211 in the encapsulation layer 240.

At the wafer level with respect to a plurality of chips, 250 a plurality of such recesses are formed. S30 in FIG. 10.

Figure 6:
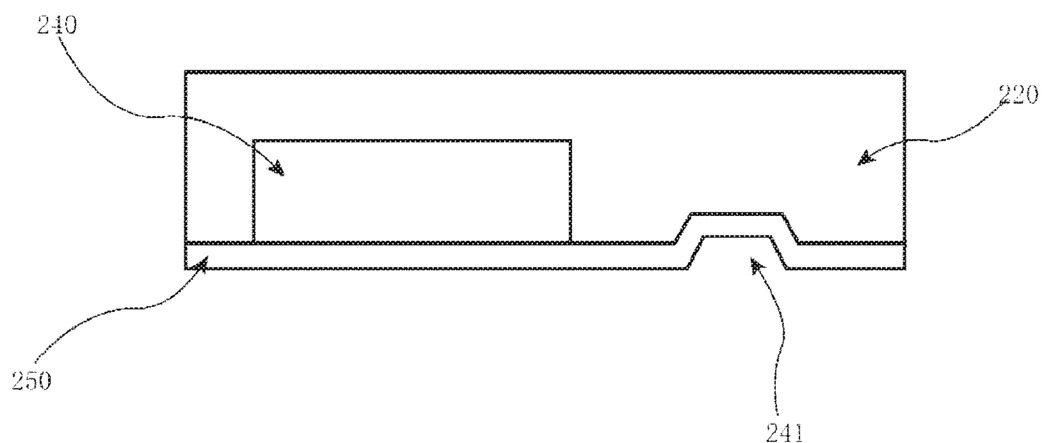

Thereafter, referring to FIG. 6, a circuit layer 250 is formed on the exposed surface of the chip 220 and in the recess 241. The circuit layer 250 may be a wiring structure formed by any techniques known per se in the art. For example, as is known per se in the wafer level fan out packaging art, per se, the circuit layer 250 may be a redistribution wiring layer 270 (See, FIG. 9) comprising inputs and outputs at opposite surfaces of an insulating layer. Refer again to FIG. 9, for example, for a schematic illustration of an example of a wiring structure in the form of a redistribution wiring layer 270.

The circuit layer 250 may be simultaneously formed across the surfaces of a plurality chips 220 embedded in the encapsulation layer 240 and in a plurality of corresponding ones of the recesses 241. S40 in FIG. 10.

Figure 7:
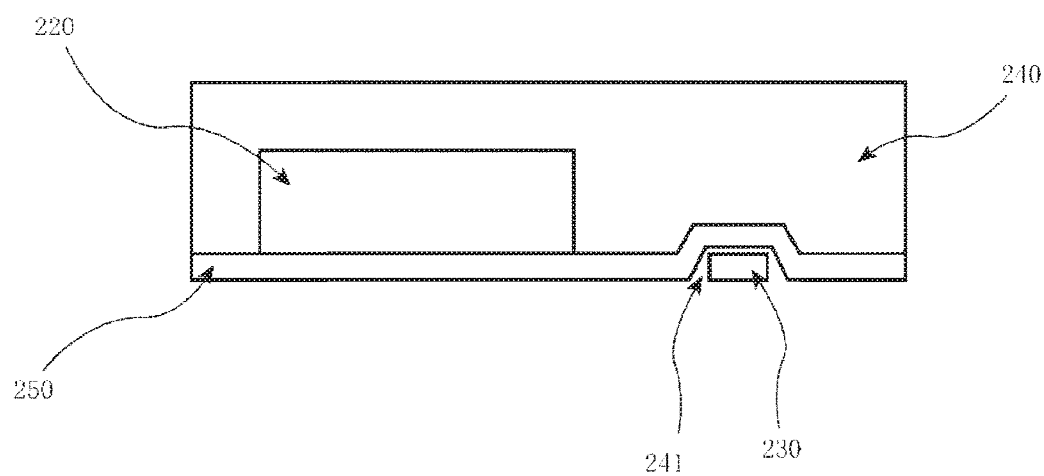

Next, referring to FIG. 7, a passive element 230 is provided in the recess 241. In an example of the inventive concept, the passive element 230 is provided in the recess 241 in contact with the circuit layer 250. In an example of the inventive concept, the passive element 230 may be connected to the circuit layer 250 by reflow soldering.

Furthermore, in examples in which a plurality of chips 220 have been embedded in the encapsulation layer 240 and a plurality of recesses 241 have been formed in the encapsulation layer 240 in association with the chips 220, passive elements 230 may be provided in the recesses 241, respectively, each electrically conductively connected to the circuit layer 250. S50 in FIG. 10.

Figure 8:
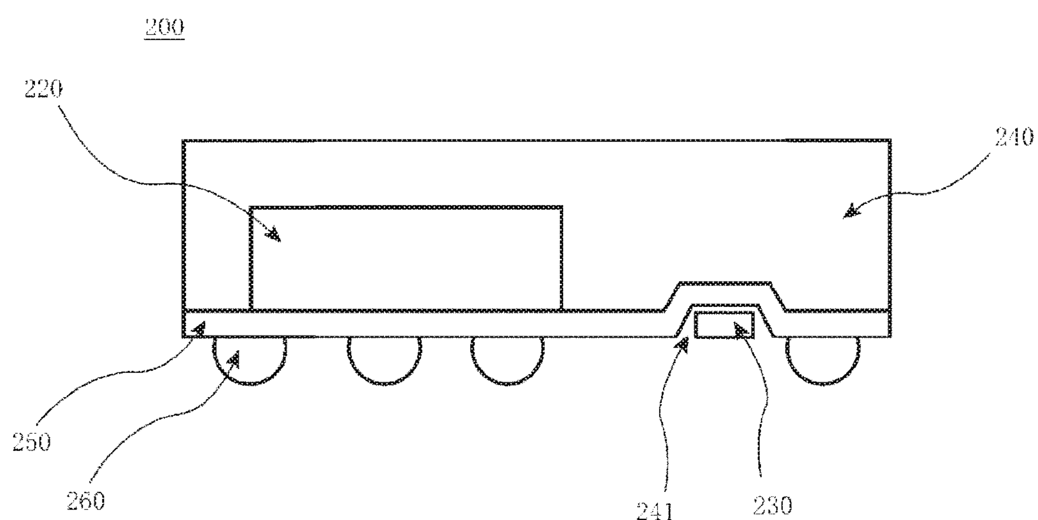

Lastly, referring to FIG. 8, solder balls 260 are provided on the circuit layer 250. The solder balls 260 may be formed by any method known per se in the semiconductor packaging art for forming external contacts. The solder balls 260 provide external terminals for connecting the package 200 to an external device, and are themselves electrically connected to the chip(s) 220 by the conductive layer, e.g., through a redistribution wiring layer comprising a conductive layer of wiring.

Any other steps needed to complete the wafer level fan-out package will be readily understood and known per se to those skilled in the art and thus, will not be described in detail. For example, as described above, a plurality of chips 220 and passive elements 230 may be formed together as provided within the encapsulation layer 240 and recesses 241, respectively. Then a dicing process may be performed to divide or "singulate" such a structure into individual packages each of the type shown in and described with reference to FIG. 2. S60 in FIG. 10.

According to the inventive concept as described above, a displacement of the passive element caused by thermal expansion of the encapsulation layer during the forming thereof may be prevented because the passive element is provided in the package after the encapsulation layer is formed. Therefore, a short circuit will not occur between the passive element and the circuit layer.

Also, in the method of manufacturing the wafer level fan-out package according to the inventive concept, manufacturing precision is greatly improved by forming the passive element after forming the circuit layer; also, the passive element may be re-manufactured during the forming of the package so as to improve the yield.

Although the inventive concept has been particularly shown and described with reference to examples thereof, those ordinary skilled in the art will understand that various changes can be made in forms and details to such examples without departing from the spirit and scope of the inventive concept as defined in the attached claims.

What is claimed is:

1. A method of manufacturing a wafer level fan-out package, comprising:

placing a chip and a base substrate against each other with an active surface of the chip facing the base substrate;

encapsulating the chip by forming an encapsulant on the base substrate;

removing the base substrate to expose the active surface of the chip and a surface of the encapsulant laterally adjacent to the chip;

forming a wiring structure on the active surface of the chip and on the surface of the encapsulant adjacent to the chip; and subsequently mounting a passive electronic component on and electrically connecting the passive electronic component to the wiring structure, wherein a recess is formed in the surface of the encapsulant laterally adjacent to the chip such that the recess is defined to one side of the chip in a direction parallel to said surface of the encapsulant, and the passive electronic component is set within the recess such that the passive electronic component is disposed to said one side of the chip in the direction parallel to said surface of the encapsulant.

2. The method of claim 1, wherein the forming of the wiring structure comprises forming a conductive layer that lines the recess while leaving a portion of the recess unfilled, and the passive electronic component is set within said portion of the recess where the passive electronic component is mounted on and electrically connected to the wiring structure.

3. The method of claim 2, wherein the recess is formed to a depth in a range of 50 to 100 μm.

4. The method of claim 2, wherein the recess is formed by providing the base substrate with a protrusion on which the encapsulant is formed, and the removing of the base substrate with the protrusion leaves the recess in the encapsulant, the recess having a shape complementary to that of the protrusion.

5. The method of claim 2, further comprising providing solder balls on the wiring structure after the passive electronic component is set in the recess, and wherein the mounting of the passive electronic component on and electrically connecting of the passive electronic component to the wiring structure comprises a reflow soldering process.

6. A method of manufacturing a wafer level fan-out package, comprising:

encapsulating a chip in an encapsulant with an active surface of the chip exposed and a recess defined in a surface of the encapsulant laterally adjacent to the active surface of the chip such that the recess is located to one side of the chip in a direction parallel to said surface of the encapsulant;

forming a wiring structure extending over the active surface of the chip and that lines the recess while leaving a portion of the recess unfilled; and setting a passive electronic component within said portion of the recess as disposed to said one side of the chip in the direction parallel to said surface of the encapsulant, and mounting the passive electronic component on and electrically connecting the passive electronic component to the wiring structure within the recess.

7. The method of claim 6, wherein the encapsulating of the chip comprises placing the chip and a base substrate, having a surface and a protrusion protruding from the surface, against each other with the active surface of the chip facing the surface of the base substrate and the protrusion of the base substrate disposed laterally of the chip, and depositing encapsulating material on the base substrate to cover the chip and the protrusion.

8. The method of claim 7, wherein the encapsulating material comprises an epoxy resin.

9. The method of claim 6, wherein the recess is formed to a depth in a range of 50 to 100 μm.

10. The method of claim 6, further comprising providing solder balls on the wiring structure after the passive electronic component is set in the recess, and wherein the mounting of the passive electronic component on and electrically connecting of the passive electronic component to the wiring structure comprises a reflow soldering process.

11. The method of claim 1, wherein the recess is formed to such a depth that a bottom of the recess is delimited by a surface of the encapsulant at a level above that of the active surface of the chip.

12. The method of claim 6, wherein a bottom of the recess is delimited by a surface of the encapsulant at a level above that of the active surface of the chip.

* * * * *